United States Patent [19]

Nelson et al.

[11] 4,191,735

[45] Mar. 4, 1980

[54] GROWTH OF SYNTHETIC DIAMONDS

[75] Inventors: Richard S. Nelson, Reading; John A. Hudson, Radley; David J. Mazey, Abingdon, all of England

[73] Assignee: National Research Development Corporation, London, England

[21] Appl. No.: 878,862

[22] Filed: Feb. 17, 1978

Related U.S. Application Data

[63] Continuation-in-part of Ser. No. 711,578, Aug. 4, 1976, abandoned, which is a continuation-in-part of Ser. No. 477,280, Jun. 7, 1974, abandoned.

[30] Foreign Application Priority Data

May 30, 1977 [ZA] South Africa ............. 77/3271
Jun. 7, 1973 [GB] United Kingdom ........ 27293/73
Jun. 2, 1977 [GB] United Kingdom ........ 23468/77

[51] Int. Cl.$^2$ ................................................ C01B 31/06
[52] U.S. Cl. ................................. 423/446; 204/173; 252/502
[58] Field of Search .............. 423/446; 204/173, 298, 204/154; 427/34, 35, 38, 39

[56] References Cited

U.S. PATENT DOCUMENTS

| | | | |
|---|---|---|---|
| 3,030,188 | 4/1962 | Eversole | 423/446 |
| 3,175,885 | 3/1965 | Brinkman et al. | 423/446 |
| 3,297,407 | 1/1967 | Wentorf | 423/446 |
| 3,371,996 | 3/1968 | Hibshman | 423/446 |
| 3,961,103 | 6/1976 | Aisenberg | 423/446 X |

OTHER PUBLICATIONS

Aisenburg et al., "J. Applied Physics," vol. 42, No. 7, 1971, pp. 2953-2958.
Angus et al., "J. Applied Physics," vol. 39, No. 6, 1968, pp. 2915-2922.

*Primary Examiner*—Edward J. Meros
*Attorney, Agent, or Firm*—Oblon, Fisher, Spivak, McClelland & Maier

[57] ABSTRACT

A method of growing a diamond crystal which comprises bombarding the diamond with a flux of carbon ions of sufficient energy to penetrate the diamond crystal and cause crystal growth which is at least predominantly internal, the temperature of the crystal being at least 400° C. and less than the graphitisation temperature, such that the diamond crystal structure is maintained during growth.

22 Claims, 1 Drawing Figure

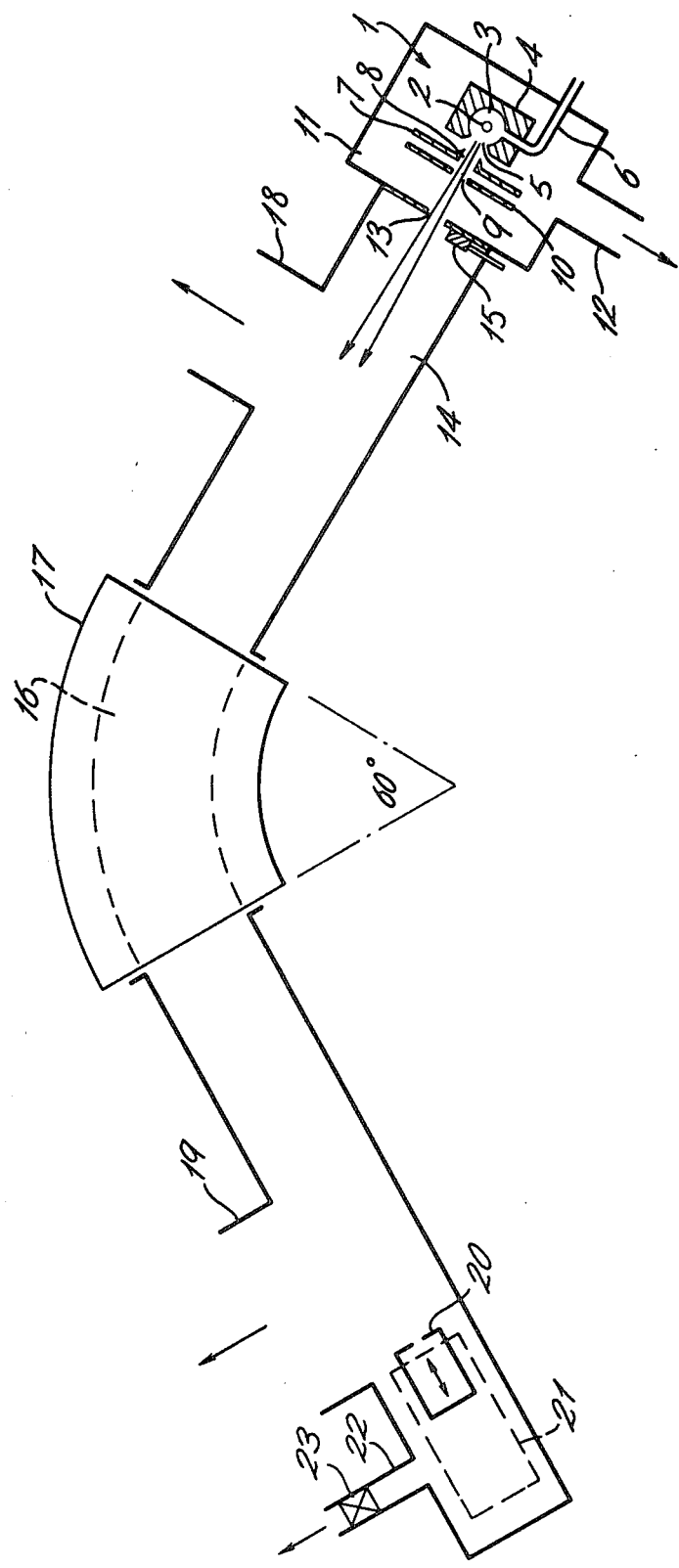

GROWTH OF SYNTHETIC DIAMONDS

This Application is a continuation-in-part of our copending Application Ser. No. 711,578 filed Aug. 4, 1976 which in turn is a continuation-in-part application of application Ser. No. 477,280, filed June 7, 1974, both now abandoned.

This invention relates to the growth of synthetic diamonds.

Proposals have been made for growing synthetic diamonds from small diamonds by, for example, depositing carbon from the vapour phase on to the diamond surface. In accordance with these proposals, crystal growth takes place on the external surfaces of the small diamond. We have now devised a method whereby a synthetic diamond may be manufactured by a process of internal growth within a small diamond crystal.

According to the present invention, a method of growing a diamond crystal comprises bombarding the diamond crystal with a flux of carbon ions of sufficient energy to penetrate the diamond crystal and cause crystal growth which is at least predominantly internal, the temperature of the crystal being such that the diamond crystal structure is maintained during growth.

It will be appreciated that the conditions of bombardment should be selected so that the possibility of radiation damage to produce amorphisation of the diamond is avoided. The "sputtering ratio", i.e. the number of atoms removed from the crystal surface by sputtering per incident ion is, of course, less than one, since otherwise the crystal under bombardment would shrink.

A particular advantage of growing crystals internally, according to the present method, is that the surface of the diamond under bombardment need not be perfect and may even be covered with a superficial layer of a contaminant material. There is generally no need therefore to employ careful cleaning techniques comprising, for example, the removal of grease and subsequent oxidation to produce a perfect surface. In practice the carbon ions are generally singly charged and of the isotope C-12, although if so desired the ions may be of another carbon isotope.

The energy of carbon ions used for bombardment must of course be sufficient to adequately penetrate the diamond crystal undergoing growth, preferably to the extent of at least 10 atomic distances. Ion energies below 600 eV may not provide adequate penetration and energies of 750 eV or more are preferred, energies of at least 1 keV being particularly preferred such as energies between 5 keV and 30 keV. Energies up to 100 keV have given satisfactory results.

The temperature at which transition from the crystalline to the amorphous state occurs is dependent on the carbon ion dose rate and if the temperature of the crystal is too low, amorphisation is liable to result. When the temperature is at least 400° C. the diamond may be bombarded at a dose rate which gives a growth rate of diamond up to 0.1 $\mu$m/hr whereas when the temperature is at least 600° C., the dose rate can be such as to give a growth rate reaching 3.2 $\mu$m/hr. Although higher temperatures may permit the use of even higher dose rates, the temperature at which the diamond begins to graphitise must not be exceeded. The graphitisation temperature is dependent on the purity of the diamond specimen and on the vacuum to which the specimen is subjected and can be established by simple experiment. Satisfactory results have however been obtained at temperatures of 800° C. or more e.g. 1000° C. and it is envisaged that the substrate may be heated to even higher temperatures, though preferably not exceeding 1075° C. The use of high substrate temperatures may allow the method of the present invention to be conducted over substantial periods of time without interruption to anneal the diamond target. Excessive heating as a result of very high dose rates, is liable to produce deterioration of the target and the current density, representing a measure of the dose rate does not usually exceed 10 mA/cm$^2$. Although, if desired, the dose rate may be small it is not usually convenient to operate at a current density below 0.01 mA/cm$^2$.

The upper limit on the pressure in the chamber through which a flux of the ions passes (the flux generally being a beam) is usually dictated by the ability of the ion beam to transverse the chamber and bombard the target and by the partial pressure of oxygen in the chamber, which affects the graphitisation temperature. In general the pressure does not exceed $10^{-3}$ torr and preferably the pressure is no greater than $10^{-4}$ torr. Although the pressure may in practice be no greater than $10^{-6}$ torr, it is usually inconvenient to reduce the pressure below $10^{-9}$ torr.

We believe, although we have not established with certainty, that the mechanism of the growth of a diamond crystal which is bombarded with carbon ions in the present method comprises the formation of interstitial loops in the crystal by ions which have penetrated therein, whereby the extra interstitial atoms thereby created plate out into said interstitial loops. Thus, the bombardment introduces one extra interstitial atom into the crystal for every ion incident on the crystal. The extra interstitial atoms preferentially plate out into interstitial loops and are not compensated by the growth of vacancy loops. The concentration and size of interstitial loops is, therefore, increased as the bombardment proceeds and the external dimensions of the crystal are thereby increased.

The nature of the growth process may be demonstrated under a given set of operating conditions by producing on the face of a diamond single crystal a deposit of an amorphous substance such as amorphous carbon or silica up to several hundred Angstroms in thickness. The crystal is then bombarded with carbon ions at a suitable dose rate and after removal of the residual amorphous deposit the thickness and nature of any growth step determined. Production of a step of diamond without complete removal of the deposit during growth demonstrates that the growth which has occurred is internal. There is of course no demarcation between the original diamond and the step. In a typical demonstration, the dose is such as to produce a diamond step of thickness approximately 1000 Å. It will be appreciated that in order to determine whether or not a given set of operating conditions gives rise to growth which is wholly internal, a duplicate experiment can be conducted in which a similar diamond crystal having a perfectly clean surface is bombarded and the thickness of the diamond step in the two products compared.

Internal growth may be further demonstrated by bombarding a crystal the face of which is divided into zones which carry a deposit of amorphous carbon or silica at a thickness varying for example from 0 to 500 Å. Removal of the residual deposit and determination that the step produced is diamond and is uniform in thickness in all the zones demonstrates the internal nature of the growth produced. It will be appreciated that when the ions have low energies it is generally necessary for the amorphous deposit to be extremely thin so that hindrance to penetration thereof is insignificant and meaningful comparison with results from bombardment of perfectly clean target surfaces can be made.

The present method may be used, if desired, for growing large diamonds for direct insertion into cutting edges, for example, in drills and lathe tools. Although it is generally desirable especially when single stones are to be grown, to orientate a beam of the ions at 90° C. to the target face, the method of the present invention may also be used, for example, to cause a number of small diamonds supported in close mutual proximity to grow together to form a continuous polycrystalline layer, in which case, it may be necessary to vary the orientation of the diamonds with respect to the ion beam in order to promote lateral growth in the initial stages of bombardment e.g. by eccentrically rocking the support on which the diamonds are disposed.

Particularly when it is desirable for diamond growth to be directionally uniform, however, it may be convenient for bombardment to be carried out while one or more small diamonds are vibrated e.g. in an open cup. It is, however, believed that the mechanism by which crystal growth occurs is independent of the orientation thereof, satisfactory growth having been obtained on {111}, {110}, and {100} surfaces.

When pure diamonds are to be produced, bombardment is generally carried out with an ion flux which consists essentially of carbon ions and it is extremely desirable in general that the level of impurities which are insoluble in the target such as gases and in particular argon and hydrogen be insignificant i.e. well below 1% of the ions in the flux. Cavitation or blistering of the target is otherwise liable to result. In some cases however it may be desirable for the flux to contain one or more impurities, commonly in trace amounts, which are soluble in the diamond. Such impurities may give rise to attractive colours or improved electrical properties. When gemstones are required for example it is generally undesirable for the flux to contain more than 3% in total of such impurities and preferably for the level to be no more than 1%. Where cutting stones are required, however, higher levels of soluble impurities may be incorporated provided that the physical properties of the product are not significantly impaired.

Improvements in the electrical conductivity may be produced by doping a diamond crystal with a small amount of an impurity such as ionic boron or phosphorus. The impurity may be present in the carbon ion flux impinging on the target crystal, usually amounting to no more than 0.1% of the flux in which case crystal growth and doping proceed synchronously, the impurity giving rise either to P-type or N-type conductivity. If so desired, however, the crystal may be alternately bombarded with a carbon ion flux and a flux of dopant ions. In this procedure a diamond layer is grown and then doped by bombardment with dopant ions, the operations being repeated if necessary until the desired thickness of doped diamond has been reached. In order to achieve a substantially uniform concentration of dopant through the diamond growth, the thickness thereof is generally allowed to reach no more than 100 A° and preferably no more than 50 A° before the growth is doped. It is generally convenient for carbon ions and P- or N-type dopant ions to be generated by different ion sources, the fluxes combining, when bombardment with the fluxes is simultaneous, before impinging on the crystal surface, the fluxes generally being independently controlled. When a PN junction is required, the crystal may be bombarded with a flux of carbon ions containing an impurity which gives rise to P or N-type conductivity following which the crystal is bombarded with ions giving rise to the other type of conductivity, such bombardment taking place either with or without bombardment by carbon ions depending on the depth below the crystal surface required for the junction.

Diamond growth produced by the present method of the present invention has substantially identical properties to those of the underlying material, e.g. refractive index values and crystal structure.

The invention is illustrated by the following Examples.

EXAMPLE 1

Samples of small diamonds which have been cleaved and polished are irradiated through a mask (to provide a demarcation line) at a temperature of 500° C. with 100 keV C+ ions from a heavy ion accelerator. The irradiation is continued to a dose sufficient to grow a step large enough to be observed readily by interference microscopy. The same procedure is then repeated but at temperatures of 600° C. and 800° C. respectively.

The products of each experiment are examined as follows. Interference microscopy shows a step corresponding to an increase in thickness of about $\frac{1}{4}$ $\mu$m. This corresponds to a growth rate of about 0.1 $\mu$m/hr. High-energy reflection electron diffraction examination clearly shows that the newly grown material is crystalline, with the same structure as the adjacent diamond material which has not been bombarded.

Also, samples of the products, examined in transmission with 200 keV electrons in a heavy ion accelerator-electron microscope link at 500° C., show no significant loss of crystallinity and the growth of an extremely fine dislocation loop array (in excess of $10^{11}$ lines/cm$^2$). Such a dislocation loop array may result in a hardening of the diamond.

EXAMPLE 2

In an alternative way of carrying out the invention, a number of diamond crystallites (for example, of size between 0.1 and 0.5 mm) are placed in a cup which is slowly vibrated to provide stirring. The vibrating crystallites are then irradiated with up to 100 mA of C+ ions at energies between 10 and 20 keV and at a temperature of about 800° C., provided by a controlled combination of resistive heating and beam heating. The crystallites steadily grow as the bombardment with the C+ ions proceeds.

EXAMPLE 3

The procedure described in Example 1 is repeated, but in this case the polished diamond is irradiated with 30 keV C+ ions at 680° C. and at a growth rate 3.2 $\mu$m/hr. Examination by the technique described reveals the existence of a growth step 7.5 $\mu$m high identified as diamond.

EXAMPLE 4

The procedure described in Example 1 is repeated, but in this case the polished diamond is irradiated with 30 keV C+ ions at 850° C. and at a growth rate 2.0 $\mu$m/hr to produce a diamond step 4.0 $\mu$m high.

EXAMPLE 5

Demonstration of Internal Growth of Diamond by C+ Ion Bombardment

A triangular diamond macle with about 4 mm sides and 1-2 mm thick is degreased in acetone, cleaned in aqua regia and finally rinsed in methanol and then distilled water in an ultrasonic bath, the {111} polished face of the crystal is sputter-coated with $SiO_2$ in parallel bands giving regions of different thicknesses, 0, 100, 300 and 500 Å respectively.

The crystal is mounted on a target heater (described in G. Faill AERE R6603, 1970) using colloidal silver (Acheson Colloids Ltd.). The specimen is masked with a slice of silicon perpendicular to the bands of deposited $SiO_2$. The heater with the mounted diamond crystal is arranged in the target chamber of a heavy ion accelerator (the Harwell Electromagnetic Separator) so that the masked {111} face of the diamond is normal to the direction of the ion beam from the ion source. The target chamber is evacuated to a pressure of about $10^{-6}$ torr and the specimen is heated to 750° C. (measured by thermocouple and optical pyrometer) and bombarded with 30 keV C+ ions. The beam current is 300-500 $\mu$A and the specimen is bombarded for 0.4 h, its temperature being maintained at 750° C. during irradiation. After irradiation the specimen is cooled to ambient temperature and removed from the accelerator. The residual $SiO_2$ is removed and the original {111} surface is examined by multiple beam interferometry and surface profilometry. A growth step is detected over all the bombarded region of the crystal with the different thicknesses of deposited $SiO_2$. Moreover the height of the growth step, 1350 Å is the same along the whole of the growth step within the limits of measurement. Thus the C+ ions have penetrated all the layers of $SiO_2$ to produce internal growth of the diamond. The height of the growth produced is the same in the uncoated area of the crystal as in the area previously coated with up to 500 Å of $SiO_2$.

The growth step is subjected to several characterisation tests described below.

Reflexion high energy electron diffraction patterns are taken (80 kV) from the irradiated crystal surface. The single crystal diamond spot pattern is still evident in the growth regions, and is essentially identical to that from the surrounding unbombarded crystal. The crystal is mounted and subjected to polishing tests. In the first test the crystal is polished for 24 hours in a vibratory polisher (Syntron Ltd) using a suspension of 500 Å alumina particles in water. In the second test the specimen is polished for 3 hours with 10 $\mu$m size diamond polish. After polishing the growth step is remeasured and no change in the step height is detected and no evidence of polishing or specimen removal is detected.

The crystal is tested chemically in aqua regia and a solution of potassium dichromate in sulphuric acid at 200° C. No dissolution occurs from either the growth step or the surrounding crystal.

EXAMPLE 6

Demonstration of Internal Growth of Diamond C+ Ion Bombardment

In a further example a similar diamond macle is cleaned and a 200 Å thick layer of amorphous carbon is deposited on a region of the polished {111} face. The crystal is then bombarded through a silicon mask with 30 keV C+ ions at a temperature of 820° C. with a beam current of 500 $\mu$A for 0.3 h. After irradiation the residual amorphous carbon is removed and the irradiated face is examined by multiple beam interferometry. A growth step is detected which has the same height (850 Å), within the limits of measurement, in the previously carbon coated region and in the uncoated region. Thus the C+ ion beam has penetrated the surface film to produce predominantly internal growth of the diamond.

The total growth step is subjected to the additional characterisation tests described in Example 5 and produces identical results.

EXAMPLE 7

A diamond crystal about 1 cm $\times$ 0.5 and 2 mm thick is cleaned and mounted on a target heater as described in Example 5. The bombarded face of the crystal is of {100} orientation and is polished. On this face two parallel strips of graphite are stuck with colloidal silver leaving a central parallel sided band 2-3 mm wide of uncovered crystal face. Growth of diamond during subsequent irradiation takes place in this region, the regions of the crystal masked by the graphite being unirradiated.

The heater with the mounted diamond crystal is arranged in the target chamber of a heavy ion accelerator (the Harwell Electromagnetic Separator) so that the masked {110} face of the diamond is normal to the direction of the ion beam from the ion source. The target chamber is evacuated to a pressure of about $10^{-6}$ torr and the specimen was heated to 680° C. (measured by thermocouple and optical pyrometer) and bombarded with 30 keV C+ ions. The beam current is 850 $\mu$A and the specimen is bombarded for 2.3 hours. During the irradiation the temperature of the crystal is maintained at 700°±20° C. The specimen is cooled to ambient temperature and removed from the heater. The graphite masks are removed, and the crystal is cleaned in nitric acid to remove excess colloidal silver.

The specimen is mounted in a cold-setting compound and the height and profile of the growth step measured with a surfometer (G.V. Planar Ltd.). The height of the growth step is 7.5 $\mu$m. The growth rate during irradiation is 3.2 $\mu$mh$^{-1}$.

The total growth step is subjected to the characterisation tests described in Example 5 giving identical results.

The crystal is then cleaved to produce smaller crystals some of which include portions of the growth step. On one of these the grown region is sufficiently thin for transmission electron microscopy at 100 kV. Examination of this area by transmission electron diffraction reveals single crystal diamond containing a high density of dislocations (greater than $10^{11}$ lines cm$^{-2}$).

EXAMPLE 8

A triangular diamond macle about 4 mm sides and 1-2 mm thick is cleaned and mounted on a target heater as described in Example 5. The bombarded face of the crystal is of {111} orientation and is polished. On this face two parallel strips of silicon are stuck with colloidal silver leading a central parallel sided band 2-3 mm wide of uncovered crystal face. Growth of diamond during subsequent irradiation takes place in this region, the regions of the crystal masked by the silicon being unirradiated.

The heater with the mounted diamond crystal was arranged in the target chamber of a heavy ion accelerator (the Harwell Electromagnetic Separator) so that the masked {111} face of the diamond is normal to the direction of the ion beam from the ion source. The target chamber is evacuated to a pressure of about $10^{-6}$ torr and the specimen is heated to 820° C. (measured by thermocouple and optical pyrometer) and bombarded with 30 keV C+ ions. The beam current is 1.5 mA and the specimen is bombarded for 5 hours. During the irradiation the temperature of the crystal is maintained at 800°±20° C. The specimen is cooled to ambient temperature and removed from the heater. The silicon masks are removed, and the crystal was cleaned in nitric acid to remove excess colloidal silver.

The height and profile of the growth step is measured as described in Example 7, the height being 5 $\mu$m. The growth rate during irradiation is 1.0 $\mu$mh$^{-1}$.

The specimen is removed from the mount, cleaned and then annealed for 2 hours at 1800° C. in an ultra high vacuum furnace. At the high temperature the pressure is $1-3\times10^{-7}$ torr. The specimen is contained in an alumina crucible in a tungsten surround and its temperature is monitored by optical pyrometry. The specimen suffers no significant weight loss and after the anneal the growth step height is unchanged, having altered in colour from amber to straw-coloured during the anneal.

The growth step is subjected to the characterisation tests described in Example 5, giving identical results.

The refractive index of the growth step is compared with that of the surrounding crystal by taking an optical transmission spectrum from 300 to 2500 nm and is the same as that of the surroundings within 7%, the accuracy of the determination.

EXAMPLE 9

A triangular diamond macle about 4 mm sides and 1-2 mm thick is prepared and bombarded in a manner identical to that described in Example 8 except that the specimen is heated to 800° C. initially, being maintained at 800°±20° C. during irradiation.

The height and profile of the growth step measured as described in Example 7 is 4 $\mu$m. The growth rate during irradiation is 0.8 $\mu$mh$^{-1}$.

The specimen was removed from the mount, cleaned and then annealed as described in Example 8, giving the same results.

The specimen is remounted on the heater target and new silicon masks are fitted over approximately the same area of the polished crystal face as previously. The 30 keV C+ ion irradiation procedure is repeated at 800° C. for 5 hours with a beam current of up to 1.5 mA. The crystal is removed from the accelerator and cleaned as previously described. The total step height is 10 $\mu$m. The specimen is annealed for 2 hours at 1800° C. as previously described and the step height remeasured.

The irradiation and annealing treatments are continued until a total growth step of 50 $\mu$m is produced in 8 irradiations at an average rate of 1.2 $\mu$mh$^{-1}$ at the irradiation temperature of 800° C. Optical micrographs are taken of the whole growth region.

Reflexion high energy electron diffraction patterns are taken (80 kV) from the irradiated crystal surface. The single crystal diamond spot pattern is still evident in the growth region and is essentially identical to that from the surrounding unbombarded crystal. X-ray back reflexion Laue diffraction patterns are taken of the growth step and the surrounding umbombarded crystal. No difference is detected between the spot patterns from the two regions. Although most of the X-rays producing the pattern come from a greater depth in the crystal than the height of the growth step, the presence of material other than diamond in the growth step would give rise to additional spots in the diffraction pattern. No such extra spots are present in the pattern.

The crystal is mounted and subjected to polishing tests. In the first test the crystal is polished for 24 hours in a vibratory polisher (Syntron Ltd) using a suspension of 500 Å alumina particles in water. In the second test the specimen is polished for 3 hours with 10 $\mu$m size diamond polish. After polishing the growth step is remeasured and rephotographed. No change in the step height is detected and no evidence of polishing or specimen removal is detected.

The crystal is tested chemically in aqua regia and a solution of potassium dichromate in sulphuric acid at 200° C. No dissolution occurs from either the growth step or the surrounding crystal.

This specimen, with the 50 $\mu$m growth step, is polished by commercial diamond polishers in order to remove half the growth thickness from the top surface. The sides of the crystal are also bevelled so that a raised portion remains in the centre of the crystal the uppermost layer of which is grown crystal. During these polishing procedures the growth step is polished as if it were simply an extension of the underlying crystal. The newly polished surface of the growth step is again examined by Reflexion High Energy Diffraction and again exhibits a diamond single cystal spot pattern.

EXAMPLE 10

A triangular diamond made of about 4 mm sides and 1-2 mm thick is prepared and bombarded in a manner identical to that described in Example 8 except that the specimen is heated to 1000° C. initially, being maintained at 1000°±20° C. during irradiation and that the irradiation is continued for 6 h at a beam current 1.0 mA.

The height and profile of the growth step is measured as described in Example 7, the height being 10 $\mu$m. The growth rate is 1.7 $\mu$mh$^{-1}$.

The Reflexion high energy electron diffraction pattern determination polishing and chemical tests described in Example 5 are conducted on the cleaned specimen giving identical results.

EXAMPLE 11

A triangular diamond made of about 4 mm sides and 1-2 mm thick is prepared and bombarded in a manner identical to that described in Example 8 except that the specimen is heated to 1050° C. initially, being maintained at 1050°±20° C. during irradiation, and that the irradiation is continued for 5 hours at a beam current 1.4 mA.

The height and profile of the growth step is measured as described in Example 7, the height being 20 $\mu$m. The growth rate is 4 $\mu$mh$^{-1}$.

The Reflexion high energy electron diffraction pattern determination, polishing and chemical tests described in Example 5 are conducted on the cleaned specimen giving identical results.

EXAMPLE 12

Doping of Diamond Growth with Boron

A {111} oriented diamond macle is heated to 800° C. in a vacuum of $4\times10^{-6}$ torr and irradiated with 30 keV C+ and 32.5 keV B+ ions alternately. The irradiations with C+ and B+ ions are of suitable intensity and durations to produce a diamond growth step of 3.4 microns which contain an essentially uniform concentration of boron at about 330 parts per million. The growth shows all the characteristics of natural diamond shown by growths produced by the 30 keV C+ irradiation previously described. In addition, four probe electrical resistivity tests show that the growth layer is conducting, with a resistance of the order $10^6$ ohms per $cm^2$.

EXAMPLE 13

Growth of p type Semiconducting Layer

A triangular macle about 4 mm sides and 1–2 mm thick is cleaned and mounted on a graphite target heater. The bombarded face of the crystal is of $\{111\}$ orientation and is polished. A small area of the face is masked by a graphite retaining cap and growth of diamond during subsequent irradiation takes place in the unmasked region.

The heater with the mounted diamond crystal is arranged in the target chamber of a heavy ion accelerator (the Harwell Electromagnetic Separator) so that the masked $\{111\}$ face of the diamond is normal to the direction of the ion beam from the ion source. The target chamber is evacuated to a pressure of about $10^{-6}$ torr and the specimen is heated to 800° C. The specimen is then bombarded alternatively with 30 keV C+ and B+ ions with the temperature maintained at 800° C.$\pm$20° C. during the bombardments. The time of the B+ bombardments are arranged to produce an average B concentration of about 300 parts per million. The time of the C+ implants is such that a growth step of about 500 Å is produced between each B implant.

The specimen is cooled to ambient temperature, removed from the heater and cleaned. The step height is measured as 2 $\mu$m. The specimen is annealed in vacuo for 15 mins. at 1500° C. and cooled to ambient temperature. Electrical tests (four print probe and thermal probe) on the bombarded face of the crystal reveal a sheet resistance of about $1 \times 10^3$ ohms per square and the presence of p-type carriers. No conductivity is detected in four point probe tests on the unbombarded polished $\{111\}$ face of the diamond macle.

The presence of B in the grown crystal is confirmed by secondary ion mass spectrometry. The crystal is placed in a 'cameca' instrument and a small area of the bombarded $\{111\}$ face is sputtered by 2 keV oxygen ions. Boron is detected in the sputtered yield throughout the grown layer.

A heavy ion accelerator (the Harwell Electromagnetic Separator) suitable for carrying out the method of the present invention is shown schematically (and not to scale) in the drawing. The apparatus is similar to that described in the following publications for the separation if isotopes:

Freeman, J. H. Proc. Inst. Mass. Spec. Conf., Kyoto 1969

Freeman, J. H. Proc. Roy. Soc. A311, 123 (1969) (Review)

Freeman, J. H. AERE Report R6254 (1970)

Referring now to the drawing, a heavy ion accelerator comprises an ion source (1) shown in cross-section, which consists of a 2 mm diameter tungsten filament (2) disposed within a recess (3) within an ion source body (4) formed from a solid block of graphite, the recess (3) communicating with an extraction slit (5) in the body with a gas supply tube (6). The extraction slit (5) is spaced from a graphite extraction electrode (7) in the form of a plate provided with a slit therein (8) in register with the extraction slit (5) of the ion source body (4) and with a slit (9) in an earthed graphite plate electrode (10) spaced from the extraction electrode. The ion source body (4) and electrodes (7, 10) are contained within a vacuum tank (11) evacuable by a tank diffusion pump (not shown) connected to a tank pump isolating valve communicating with the tank by way of a tank port (12). The vacuum tank (11) communicates, by way of an aperture (13) in register with the extraction slit, with a vacuum tube (14) isolable from the tank (11) by an isolating valve (15) capable of slidably closing the aperture (13). A region of the tube (16) approximately mid-way between the ends thereof is curved through 60° and in this region (16) is surrounded by a sector magnet (17). The tube (14) is provided adjacent each end thereof respectively with first and second tube diffusion pumps (not shown) connected to tube pump isolation valves (not shown) communicating with the tube by way of first and second tube ports (18, 19). The end of the tube furthest from the ion source, (1) contains a target stage (20) comprising an electrically heated stainless steel or molybdenum cylinder (not shown) movable towards and away from the ion source (1). The temperature of the cylinder is monitored by a Pt/Rh thermocouple (not shown). The latter tube end also contains a liquid nitrogen trap (21) and communicates by way of a third tube port (22) with a roughing pump (not shown) provided with a roughing pump isolating valve (23).

In operation, a gas such as carbon monoxide is fed into the ion source (1) where it becomes ionised by passage of a current, typically 150 A at 5 V, through the filament (2) which is maintained as a negative potential, typically 90 V, with respect to the ion source body (4). In order to enhance the rate of ionisation of the gas a weak magnetic field, typically 100 G, is applied parallel to the filament by a magnet (not shown). The source body is maintained typically at 40 keV positive whilst the extraction electrode is maintained typically at $-1$ keV with respect to the earthed electrode (10). The dimensions of the extraction slit (5) are typically: 40 mm high by 2 mm wide. Ions of carbon and oxygen are extracted from the ion source at a current level of several mA and pass through the magnetic field provided by the sector magnet which separate the carbon oxygen and other beams by virtue of their different mass. By adjustment of the voltage on the negative extraction electrode (7) and of the magnetic field a pure carbon ion beam can be focussed on to the target (20). Typical carbon beam currents are such that the current density on the target can reach 2–3 mA $cm^{-2}$. Under typical operating conditions pressures in the various parts of the system are as follows:

a. In the recess (3) within the ion source body (4): between $10^{-2}$–$10^{-3}$ torr.

b. In the vacuum tank (11) typically $10^{-4}$ torr.

c. In the region of the vacuum tube between the ends: $10^{-5}$ torr.

d. At the target end of the vacuum tube typically between $10^{-5}$–$10^{-6}$ torr.

A 50 Hz triangular shape waveform of about 1 keV may be superimposed on the ion source chamber potential in order to cause the beam to sweep horizontally and thus cover a relatively large area of target.

Diamond crystals are attached to the front face of the heater using a carbon or silver dag, and, experimentally, a mask to provide a demarcation line on the crystal surface, usually made from either silicon or carbon, is attached also by means of carbon or silver dag. In a typical experiment the crystal temperature is raised to the appropriate value prior to bombardment of the surface with the ion beam. The ion beam itself provides some heating and a target temperature is therefore controlled by reducing the electrical power input.

We claim:

1. A method of growing a diamond crystal which comprises bombarding the diamond with a flux of carbon ions of sufficient energy to penetrate the diamond crystal and cause crystal growth which is at least predominantly internal, the temperature of the crystal being at least 400° C. and less than the graphitisation temperature, such that the diamond crystal structure is maintained during growth.

2. A method according to claim 1, in which the carbon ion energy is at least 600 eV.

3. A method according to claim 1, in which the carbon ion energy is at least 750 eV.

4. A method according to claim 1, in which the ion energy is at least 1 keV.

5. A method according to claim 1, in which the ion energy is no greater than 100 keV.

6. A method according to claim 1, in which the ion energy is less than 20 keV.

7. A method according to claim 1, in which the temperature of the crystal is at least 600° C. and less than the graphitisation temperature during bombardment.

8. A method according to claim 1, in which the crystal temperature is at lease 800° C. and less than the graphitisation temperature.

9. A method according to claim 1, in which the crystal temperature is at least 1000° C. and less than the graphitisation temperature.

10. A method according to claim 1, in which the dose rate represented by the current density lies in the range 0.01–10 mA/cm$^2$.

11. A method according to claim 1, in which the ion beam passes through a vacuum chamber in which the pressure is no greater than $10^{-3}$ torr.

12. A method according to claim 11, in which the pressure is no less than $10^{-9}$ torr.

13. A method according to claim 1, in which the ion beam consists essentially of carbon ions.

14. A method according to claim 1, in which the diamond is bombarded with a flux of carbon ions containing an ionic impurity whereby the impurity is incorporated into the diamond crystal.

15. A method according to claim 14, in which the flux of carbon ions contains no more than 3% of the ionic impurity.

16. A method according to claim 14, in which the ion flux contains no more than 1% of the impurity.

17. A method according to claim 1, in which the carbon ion flux contains an ionic impurity whereby the crystal is doped with an impurity.

18. A method according to claim 17, in which the ionic impurity is an ion of boron.

19. A method according to claim 14, in which the ionic impurity effects colouration of the diamond.

20. A method according to claim 1, in which one or more diamonds are subjected to vibration during bombardment so that directionally uniform growth thereof is maintained.

21. A method according to any of claim 1, in which a plurality of diamonds are supported in close mutual proximity during bombardment and in which lateral growth thereof is promoted so that the diamonds form a polycrystalline mass.

22. A method according to claim 21, in which lateral growth is promoted by variation in the orientation of the diamonds with respect to the ion flux.

* * * * *